United States Patent [19]
Blomgren et al.

[11] Patent Number: 6,088,830
[45] Date of Patent: Jul. 11, 2000

[54] METHOD AND APPARATUS FOR LOGIC CIRCUIT SPEED DETECTION

[75] Inventors: James S. Blomgren; Terence M. Potter, both of Austin, Tex.

[73] Assignee: Evsx, Inc., Austin, Tex.

[21] Appl. No.: 09/124,207

[22] Filed: Jul. 28, 1998

Related U.S. Application Data

[60] Provisional application No. 60/069,250, Dec. 11, 1997.

[51] Int. Cl.[7] .................................................. G11B 27/00
[52] U.S. Cl. .................................... 714/814; 375/360
[58] Field of Search .................................... 714/814, 815, 714/811, 724, 821, 43, 56; 375/360, 359, 244, 245, 246

[56] References Cited

U.S. PATENT DOCUMENTS

| | | | |
|---|---|---|---|
| 4,144,448 | 3/1979 | Pisciotta et al. | 714/814 |
| 4,542,509 | 9/1985 | Buchanan et al. | 714/814 |
| 4,800,564 | 1/1989 | DeFazio et al. | 714/814 |
| 5,451,892 | 9/1995 | Bailey | 327/113 |
| 5,479,420 | 12/1995 | Hong et al. | 714/814 |
| 5,490,059 | 2/1996 | Mahalingaiah et al. | 364/166 |
| 5,712,855 | 1/1998 | Goto et al. | 714/700 |
| 5,790,443 | 8/1998 | Shen et al. | 364/746 |

*Primary Examiner*—Trinh L. Tu
*Attorney, Agent, or Firm*—Booth & Wright, L.L.P.; Matthew J. Booth; Karen S. Wright

[57] ABSTRACT

The present invention discloses an apparatus and method for determining the speed of a logic circuit relative to the clock. The preferred embodiment utilizes dynamic logic to deliver a critical signal to a transition detection circuit, which performs the OR/NOR function on the signals. In one embodiment the transition detection circuit comprises static logic. In another embodiment, the transition detection circuit comprises an N-NARY gate that performs the OR/NOR function. The output of the transition detection circuit is fed into a series of delayed flip-flop latches, which determine when the critical signal transitioned from the pre-charge state relative to the clock.

13 Claims, 2 Drawing Sheets

METHOD AND APPARATUS FOR LOGIC CIRCUIT SPEED DETECTION

This application claims the benefits of the earlier filed U.S. Provisional application Ser. No. 60/069,250, filed Dec. 11, 1997, which is incorporated by reference for all purposes into this application.

BACKGROUND OF THE INVENTION

Field of the Invention

The present invention relates to digital computing, and more particularly to mechanisms and techniques to detect the speed of logic within a processor.

Description of the Related Art

The frequency of a processor CPU clock signal is an important factor in evaluating the overall performance of a computer system. In general, as the speed of the processor clock signal increases, the time required to execute various instructions decreases. The speed of the clock signal is limited by several factors. These factors include temperature, process variation, and voltage skew, and may include many other conditions. In typical synchronous designs, manufacturers of logic chips usually provide a maximum clock frequency that is guaranteed to operate properly under worst-case conditions. The system designer then must ensure that the system designed around that particular logic chip "meets" the worst-case specification. This worst-case clock rate provides degraded performance at any time that the processor is running under better than worst-case conditions. Often-times the system is designed to not only meet the worst-case specification but to operate under very favorable conditions and therefore is capable of operating at a higher clock rate in those conditions. Conversely, if a designer wants to design a system that operates in a harsh environment, she generally cannot get a logic chip that is specified to operate properly in that environment. What is desired is an apparatus and method for dynamically altering the clock rate of a processor to allow for maximum performance under varying conditions.

The prior art discloses inventions for dynamically altering the clock rate of a processor. U.S. Pat. No. 5,490,059, issued to Mahalingaiah et al, and U.S. Pat. No. 5,451,892 issued to Bailey, both disclose inventions that use the temperature of the semiconductor die in determining the frequency of a timing signal to be applied to a processor clock. These inventions are motivated by a desire to operate a logic chip at a speed that need not account for thermal margins. When a logic chip is sold by a manufacturer, it is usually guaranteed to operate at or below a specified temperature. Since the manufacturer does not usually control the choice of the enclosure that the logic chip will be installed in, or what climate the resulting system will be used in, the logic chip is clocked at a rate where it can function in a worst-case environment. It is usually necessary for the manufacturer, when specifying the maximum temperature, to assume that the enclosure will have little ventilation. It is also usually necessary for the manufacturer to assume that the part will be used in an environment where the air temperature is 40° C.—an uncommon occurrence.

The prior art presents serious shortcomings. One such shortcoming is the inherent inaccuracy of on-die thermal sensors because these sensors are subject to process variations. These process variations present the undesirable requirement that the computer containing a prior art device be calibrated.

Another shortcoming of the prior art is that the most demanding applications will run slower on prior art systems than less demanding applications will. The function being performed by a chip affects its operating speed under the prior art systems because the chip itself generates heat. The difference between the allowed temperature and the actual temperature of the surrounding air determines the rate at which such heat dissipates. In circumstances when a demanding application is being run on a system with the prior art device in an environment approaching the maximum heat specification, the heat generated by the chip can cause the clock to slow. For instance, when running a computer game that involves a relatively large number of floating point calculations, more of the circuits in a traditionally designed computer will be switching and therefore generating relatively more heat than simpler applications. Such a situation is more likely to cause the prior art chips to exceed their thermal limits and therefore slow their clocks. The result is undesirable from a user's point of view, in that his most demanding applications will run slower than his less demanding ones. The present invention overcomes these drawbacks of the prior art.

The apparatus and method of the present invention overcome, in large part, the reduced efficiency problems associated with a predetermined clock rate that will guarantee satisfactory performance under worst-case conditions. That is, the present invention detects when a processor is operating under conditions that are better than the worst-case situation, so that adjustments may be made to allow a processor to work at a higher clock rate. The present invention directly measures signal speed and requires less margin than the prior art systems that adjust clock rate based on temperature.

SUMMARY OF THE INVENTION

The present invention discloses an apparatus and method for determining the speed of a logic circuit relative to the clock. Such information may be used to dynamically control the frequency of a processor clock. The preferred embodiment utilizes dynamic logic to deliver a critical signal to the transition detection circuit. In the preferred embodiment, the transition detection circuit comprises a static NOR gate. In an alternative embodiment, the transition detection circuit comprises an N-NARY circuit that "or's" all N wires of an N-NARY 1-of-n signal. The transition detection circuit detects that a critical signal has transitioned from the pre-charge state. The output of the transition detection circuit is fed into a series of delayed flip-flop latches. This allows the present invention to determine when the critical signal transitioned from the pre-charge state relative to the clock. Using this information, the present invention may be used by a dynamic clock adjustment circuit to vary the speed of the clock.

DETAILED DESCRIPTION OF THE INVENTION

The present invention relates to detecting the speed of a circuit and using that information to dynamically control a processor clock. This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail some well-known structures, such as flip-flop storage elements, NOR gates, DDL's, PLL's, and CPU clocks in order not to obscure the present invention.

Figure 1:
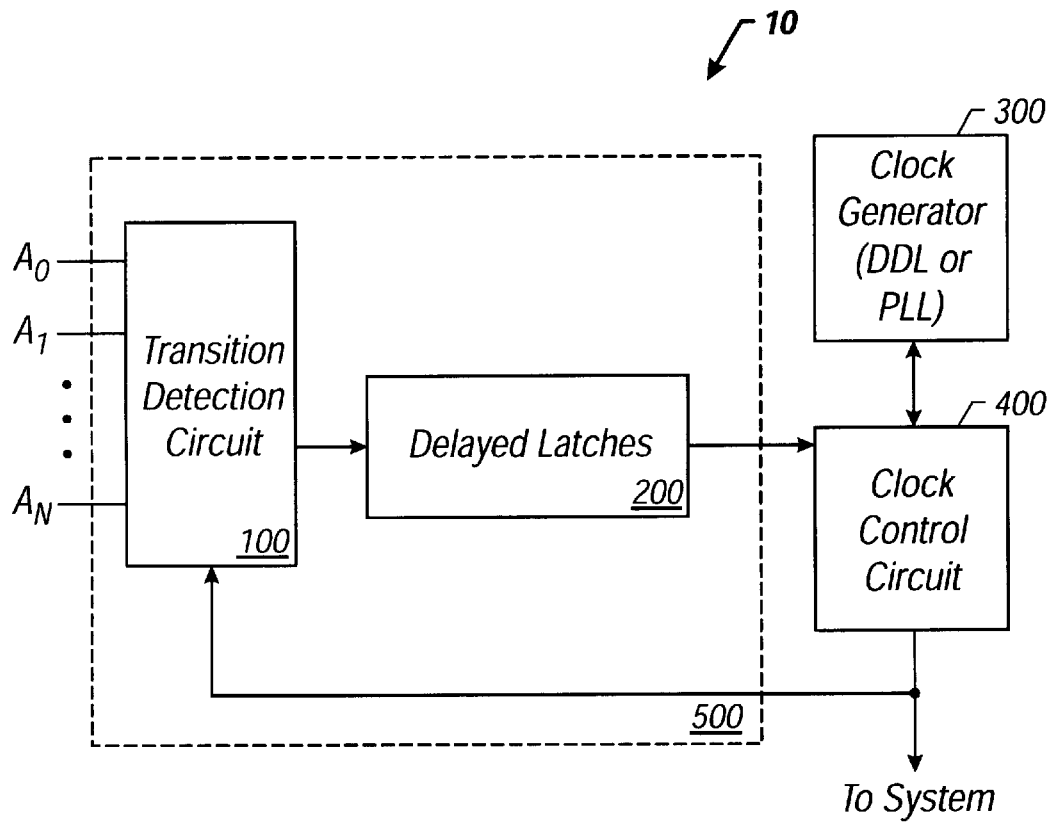
FIG. 1 is a block diagram of the speed detection circuit of the present invention.

FIG. 1 illustrates a dynamic clock adjustment circuit 10 that utilizes the speed detect circuit 500 of the present invention. The present invention presents an improvement over the prior art because the present invention does not use temperature to drive its dynamic clock frequency adjustments. Instead, the present invention assumes that a logic chip must be able to dissipate its maximum heat so long as the critical paths of the chip's circuit design meet, or run faster than, the clock period. While CMOS circuits do operate more slowly when they experience higher temperatures, the reduction in achievable clock speed is much less than the increase in temperature. The present invention therefore keys clock frequency to the speed of the chip's logic circuits. In other words, the present invention dynamically controls the clock signal to prevent the circuit from running at a clock rate faster than the circuit's signals will allow. By the same token, the present invention will allow the circuit to run at a faster clock rate if the signal logic is evaluating faster than the clock by a pre-determined margin.

The speed detection circuit 500 illustrated in FIG. 1 senses the actual propagation delay of critical signals. FIG. 1 illustrates the circuit in an embodiment using either dual-rail dynamic logic or N-NARY logic rather than static binary logic. Both dual-rail dynamic logic and N-NARY logic are types of pre-charge logic.

The N-NARY logic is described in a copending patent application, U.S. Pat. application Ser. No. 09/193,55, filed Feb. 5, 1998, is still pending, and titled "Method and Apparatus for a N-NARY logic Circuit Using 1 of 4 Signals". N-NARY logic is pre-charge logic. That is, N-NARY signals are represented by N wires all of which are pre-charged to a low voltage during the pre-charge phase of the gate in question. During operation of the speed detection circuit illustrated in FIG. 1, exactly one of the N wires, $A_0$, $A_1$, . . . $A_N$, will switch (precisely once) from a low voltage to a high voltage, and stay there until the next pre-charge phase. This means that one can tell precisely when a gate has evaluated, relative to the clock, by determining when a low-to-high transition has occurred.

The speed detect circuit 500 senses the propagation delay for critical signals in two stages. First, a transition detection circuit 100 captures the current state of critical signals. The transition detection circuit performs the OR/NOR function. One skilled in the art will appreciate that one function is the inverse of the other function. Second, a series of delayed latches 200 captures the time, relative to the clock, when a critical path has evaluated. This information can then be used to adjust the clock.

Figure 2:
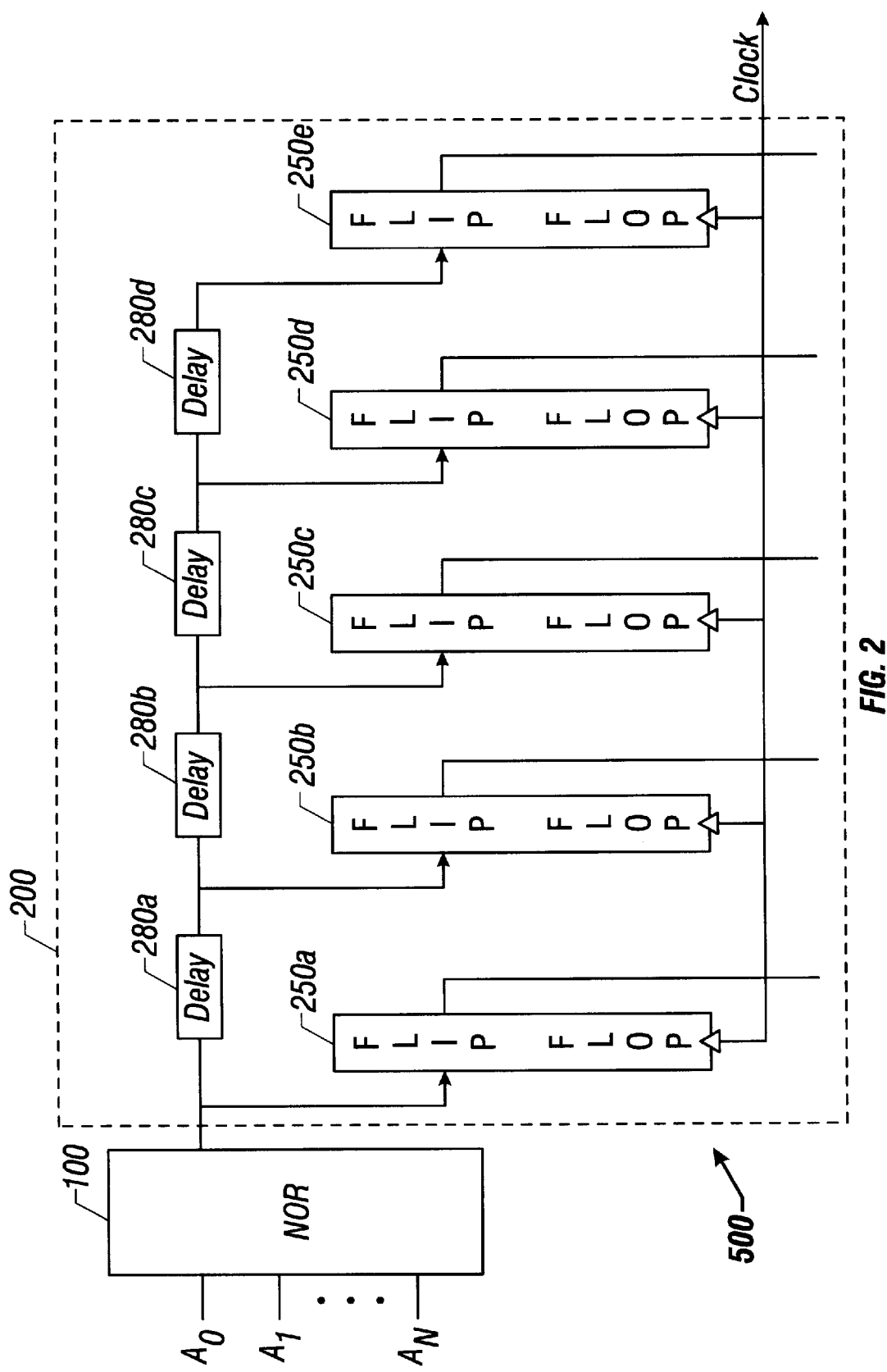
FIG. 2 is a block diagram of the static NOR gate and delayed latches of the preferred embodiment of the present invention.

FIG. 2 illustrates an embodiment where the transition detection circuit 100 comprises a static NOR gate. The NOR gate 100 simply "collapses" each of the N possible signal values for each critical signal into a single indication of when the signal has arrived.

Figure 3:
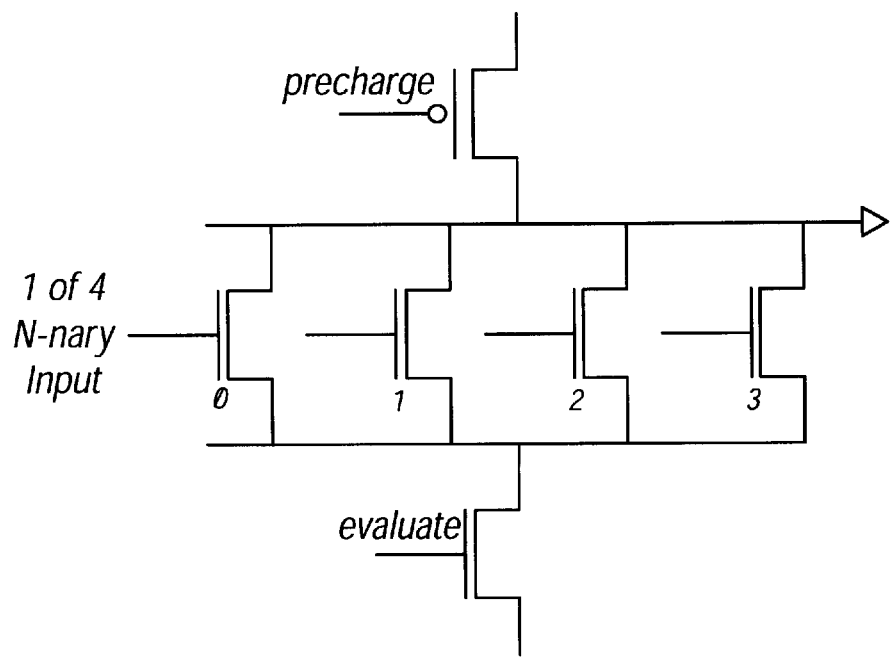
FIG. 3 is a circuit diagram of a circuit that performs the OR/NOR function on a 1-of-4 input signals.

FIG. 3 illustrates an alternative embodiment of the transition detection circuit 100 wherein such circuit comprises an N-NARY circuit that "or's" the wires of the N-NARY signal together.

To select the inputs to the transition detection circuit 100, a set of representative critical paths is selected in a manner well known in the art. Such manner is similar to selecting a set of paths to use in speed-sorting parts on the production line. When collapsing together all of the wires that form a dual-rail signal or a 1-of-N signal for a critical path, the output from the transition detection circuit 100 will be a high voltage value when the signal in question is pre-charged (i.e., all of its wires are at a low voltage). When the signal evaluates, one of the inputs to the transition detection circuit 100 will switch from a low voltage to a high voltage, and the transition detection circuit 100 output will switch from a high voltage to a low voltage. This transition from high-to-low voltage is an indication that the critical path finished evaluating relative to the clock.

A series of storage elements such as flip-flops 250 capture the transition of a critical signal (as detected by the transition detection circuit 100). FIG. 2 illustrates that each flip-flop 250 receives a slightly more delayed version, than the previous flip-flop 250, of the output from the transition detection circuit 100. This output is the transition detect signal 150. In this fashion, some of the flip-flops 250 will successfully capture the transition detect signal 150, while others will not (because the cumulative delay on the transition detect signal 150 pushes it past the capture point for that latch). The flip-flops which capture the transition will contain a zero, while the ones which do not, will contain a one (the value of the transition-detect signal 150 prior to evaluation of the critical signal 125). The number of zeros in the flip-flops 250 is an indication the current level of margin that the clock has relative to this critical path. The transition from zero to one is an indication of when the path finished evaluating relative to the clock. This information is then used by the clock control circuit of the present invention to generate a command signal to adjust the speed of the clock. Adjusting the clock frequency is accomplished in one embodiment by directly controlling a digital delay loop (DLL) with a command signal. In a second embodiment the clock frequency is adjusted by feeding a command signal into the phase comparator of a phase locked loop (PLL). Both DDL's and PLL's are well known in the art.

An advantage of the present invention over the prior art is that clock speed is not keyed to temperature. Instead, the present invention adjusts the speed of the clock to accommodate the current speed of the logic in a logic chip. The measurement of logic speed is a summation of more conditions than temperature. The logic speed measurement also includes all forms of process variation and voltage skew. The present invention will adjust the speed of the clock down only when the clock is running faster than the logic of the chip will allow, regardless of temperature.

A further advantage of the present invention is that it does not suffer from the inaccuracies of a thermal sensor. The present invention's speed detection circuit can very accurately detect the actual propagation delay for critical signals. As a result, the present invention is more accurate at detecting the complex combination of temperature, process variations, and voltage than the prior art is at detecting the more simplistic thermal fluctuations it is designed to detect.

The present invention focuses on a more important performance variable than systems incorporating the prior art dynamic clock adjustment technique. This is true because voltage, rather than temperature, actually has a greater effect on signal propagation time. Sensing actual propagation times accounts for voltage margins, while the thermal detection technique of the prior art does not. This allows the present invention to provide enhanced performance by eliminating a more meaningful margin, voltage, instead of temperature.

Another advantage of the present invention flows from the fact that voltages do not ordinarily fluctuate from one environment to the next. Accordingly, the present invention does not expose users to differing performance rates in locations of differing temperatures. Instead, the present invention enables a logic chip to run at a speed determined by the voltage supplied to the system, the process quality of the chip itself, and, to a lesser extent, temperature.

And finally, another advantage of the present invention over the prior art is that the present invention essentially eliminates variations in performance as a function of the complexity of the application. This is due to the constant-current nature of the N-NARY design style. With constant current N-NARY logic, the logic chip will generate the same amount of heat whether it is idle or running a very complex application.

The apparatus and method of the present invention overcome, in large part, the reduced efficiency problems associated with a predetermined clock rate that will guarantee satisfactory performance under worst-case conditions. That is, under conditions that are better than the worst-case situation, the present invention will detect that a processor's logic is running faster than the clock and adjustments may then be made to allow a processor's logic to work at a higher clock rate. The present invention allows the speed of the logic chip's circuitry to drive clock speed rather than relying on on-die thermal sensors to drive the clock speed.

The present invention discloses an apparatus and method for determining the speed of a logic circuit relative to the clock. The preferred embodiment utilizes dynamic logic to deliver a critical signal to a transition detection circuit. The transition detection circuit detects that a critical signal has transitioned from the pre-charge state and feeds its output into a series of delayed flip-flop latches. This allows the speed detect circuit to determine when the critical signal transitioned from the pre-charge state relative to the clock.

We claim:

1. A speed detection circuit comprising:
   two or more dynamic critical signal pathways;
   a transition detection circuit that or's together all of said dynamic critical signal pathways, said transition detection circuit is coupled to said critical signal pathways;
   one or more latches coupled to receive the output of said transition detection circuit; and
   one or more delays coupled to each of said latches.

2. The speed detection circuit of claim 1 wherein said transition detection circuit comprises a static OR/NOR gate.

3. The speed detection circuit of claim 1 wherein said transition detection circuit comprises an N-NARY OR/NOR gate.

4. The speed detection circuit of claim 1 wherein said critical signal pathways comprise a 1-of-4 dynamic logic signal.

5. A circuit for detecting the speed of a logic circuit, comprising:

a critical signal means for delivering two or more dynamic critical signals;
   a transition detection means for determining that one of said dynamic critical signals has transitioned from the pre-charge state;
   a delay latch means for determining when one of said dynamic critical signals has transitioned from the pre-charge state relative to the clock;
   a means for coupling said critical signal means to said transition detection means; and
   a means for coupling said transition detection means to said delay latch means.

6. The circuit of claim 5 wherein said transition detection means comprises a means for performing the OR/NOR function on two or more dynamic logic signals.

7. The circuit of claim 5 wherein said transition detection means comprises a means for performing the OR/NOR function on two or more dynamic 1-of-4 logic signals.

8. A method for manufacturing a speed detection circuit comprising:
   providing two or more dynamic critical signal pathways;
   providing a transition detection circuit;
   coupling said transition detection circuit to said dynamic critical signal pathways;
   providing one or more latches;
   coupling said latches to receive the output of said transition detection circuit;
   providing one or more delays; and
   coupling one or more of said delays to each of said latches.

9. The method of claim 8 wherein said step of providing a transition detection circuit further comprises providing an OR/NOR gate.

10. The method of claim 8 wherein said step of providing one or more dynamic critical signal pathways further comprises providing one or more 1-of-4 dynamic logic signals.

11. A method of detecting the speed of a logic circuit, comprising:
    delivering two or more dynamic critical signals;
    determining that one of said critical signals has transitioned from the pre-charge state; and
    using a series of delayed latches to determine when said critical signal has transitioned from the pre-charge state relative to the clock.

12. The method of claim 11 wherein said step of determining that said critical signal has transitioned from the pre-charge state further comprises performing the OR/NOR function on two or more dynamic logic signals.

13. The method of claim 11 wherein said step of determining that said critical signal has transitioned from the pre-charge state further comprises performing the OR/NOR function on two or more 1-of-4 dynamic logic signals.

* * * * *

UNITED STATES PATENT AND TRADEMARK OFFICE
CERTIFICATE OF CORRECTION

PATENT NO. : 6,088,830
DATED : July 11, 2000
INVENTOR(S) : Blomgren et al.

Page 1 of 1

It is certified that error appears in the above-identified patent and that said Letters Patent is hereby corrected as shown below:

Column 2,
Line 45, "1-of-n" should be -- 1-of-N --.
Line 62, "signals" should be -- signal --.

Column 3,
Line 37, "09/193,55," should be -- 09/019,355 --.

Column 4,
Line 66, delete the comma between "margin" and "voltage".

Signed and Sealed this

Sixteenth Day of October, 2001

Attest:

*Nicholas P. Godici*

NICHOLAS P. GODICI
*Attesting Officer*    *Acting Director of the United States Patent and Trademark Office*